(12) United States Patent
Fekih-Romdhane

(10) Patent No.: US 7,940,582 B2
(45) Date of Patent: May 10, 2011

(54) INTEGRATED CIRCUIT THAT STORES DEFECTIVE MEMORY CELL ADDRESSES

(75) Inventor: Khaled Fekih-Romdhane, Burlington, VT (US)

(73) Assignee: Qimonda AG, Munich (DE)

( * ) Notice: Subject to any disclaimer, the term of this patent is extended or adjusted under 35 U.S.C. 154(b) by 250 days.

(21) Appl. No.: 12/134,540

(22) Filed: Jun. 6, 2008

(65) Prior Publication Data
US 2009/0303814 A1    Dec. 10, 2009

(51) Int. Cl.
*G11C 29/00* (2006.01)

(52) U.S. Cl. ........... 365/200; 365/189.2; 365/189.05; 365/189.07; 365/201; 365/230.03; 365/230.08; 365/238.5

(58) Field of Classification Search ........... 365/200, 365/189.2, 189.05, 189.07, 201, 230.03, 365/230.08, 238.5
See application file for complete search history.

(56) References Cited

U.S. PATENT DOCUMENTS

| | | | |
|---|---|---|---|
| 5,764,655 A | 6/1998 | Kirihata et al. | |
| 6,768,694 B2 | 7/2004 | Anand et al. | |
| 6,769,081 B1 | 7/2004 | Parulkar | |
| 6,856,569 B2 | 2/2005 | Nelson et al. | |
| 6,922,649 B2 | 7/2005 | Mondahl et al. | |
| 6,928,377 B2 | 8/2005 | Eustis et al. | |
| 7,053,470 B1 | 5/2006 | Sellers et al. | |
| 7,237,153 B2 * | 6/2007 | Di Ronza et al. | 714/701 |
| 7,254,078 B1 | 8/2007 | Park et al. | |
| 2006/0018159 A1 * | 1/2006 | Picca et al. | 365/185.17 |
| 2006/0092725 A1 * | 5/2006 | Min et al. | 365/200 |
| 2007/0047347 A1 | 3/2007 | Byun et al. | |
| 2007/0079052 A1 | 4/2007 | Hasegawa et al. | |
| 2007/0165468 A1 * | 7/2007 | Nishihara et al. | 365/200 |
| 2008/0232148 A1 * | 9/2008 | Yabe | 365/49.1 |
| 2009/0006887 A1 * | 1/2009 | Lee et al. | 714/5 |

* cited by examiner

*Primary Examiner* — Amir Zarabian
*Assistant Examiner* — Fernando N Hidalgo
(74) *Attorney, Agent, or Firm* — Dicke, Billig & Czaja, P.L.L.C.

(57) ABSTRACT

An integrated circuit including an array of memory cells, a circuit, volatile storage, and non-volatile storage. The circuit is configured to detect defective memory cells in the array of memory cells and provide addresses of the defective memory cells. The volatile storage is configured to store the addresses, where each entry in the volatile storage includes one of the addresses and a volatile storage master bit. The non-volatile storage is configured to store the addresses, where each entry in the non-volatile storage includes one of the addresses and a non-volatile storage master bit.

20 Claims, 4 Drawing Sheets

INTEGRATED CIRCUIT THAT STORES DEFECTIVE MEMORY CELL ADDRESSES

BACKGROUND

Integrated circuit speeds continue to increase and the amount of data communicated between circuits continues to increase to meet the demands of system applications. As data volume increases, the industry continues to develop semiconductor memory devices having more memory to accommodate the increased data requirements. These trends of increasing circuit speeds, increasing data volume, and memory devices having more memory are expected to continue into the future.

Typically, a semiconductor memory device includes a mass-storage memory, such as a dynamic random access memory (DRAM) or a static random access memory (SRAM). The mass-storage memory includes memory cells in one or more memory cell arrays. The memory device can be one integrated circuit chip or multiple integrated circuit chips in a multi-chip package.

Often, the mass-storage memory includes redundant memory cells that can be used for repair. The mass-storage memory is tested at wafer level testing and defective memory cells are identified. The defective memory cells can be hard failures, such as stuck-at-one or stuck-at-zero failures, insufficient data retention times, or any other failure that prevents the device from operating efficiently. Laser-blown fuses on the memory device are blown to replace the defective memory cells with redundant memory cells prior to packaging.

However, during manufacturing a memory device may be harmed by contamination or stresses, such as thermal stress due to packaging, thermal stress sustained in the attachment of a packaged or unpackaged device to a substrate, high-voltage testing, and electro-static discharge. As a result, after manufacturing, the memory device may include defective memory cells that have not been repaired.

For these and other reasons there is a need for the present invention.

SUMMARY

One embodiment described in the disclosure provides an integrated circuit including an array of memory cells, a circuit, volatile storage, and non-volatile storage. The circuit is configured to detect defective memory cells in the array of memory cells and provide addresses of the defective memory cells. The volatile storage is configured to store the addresses, where each entry in the volatile storage includes one of the addresses and a volatile storage master bit. The non-volatile storage is configured to store the addresses, where each entry in the non-volatile storage includes one of the addresses and a non-volatile storage master bit.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
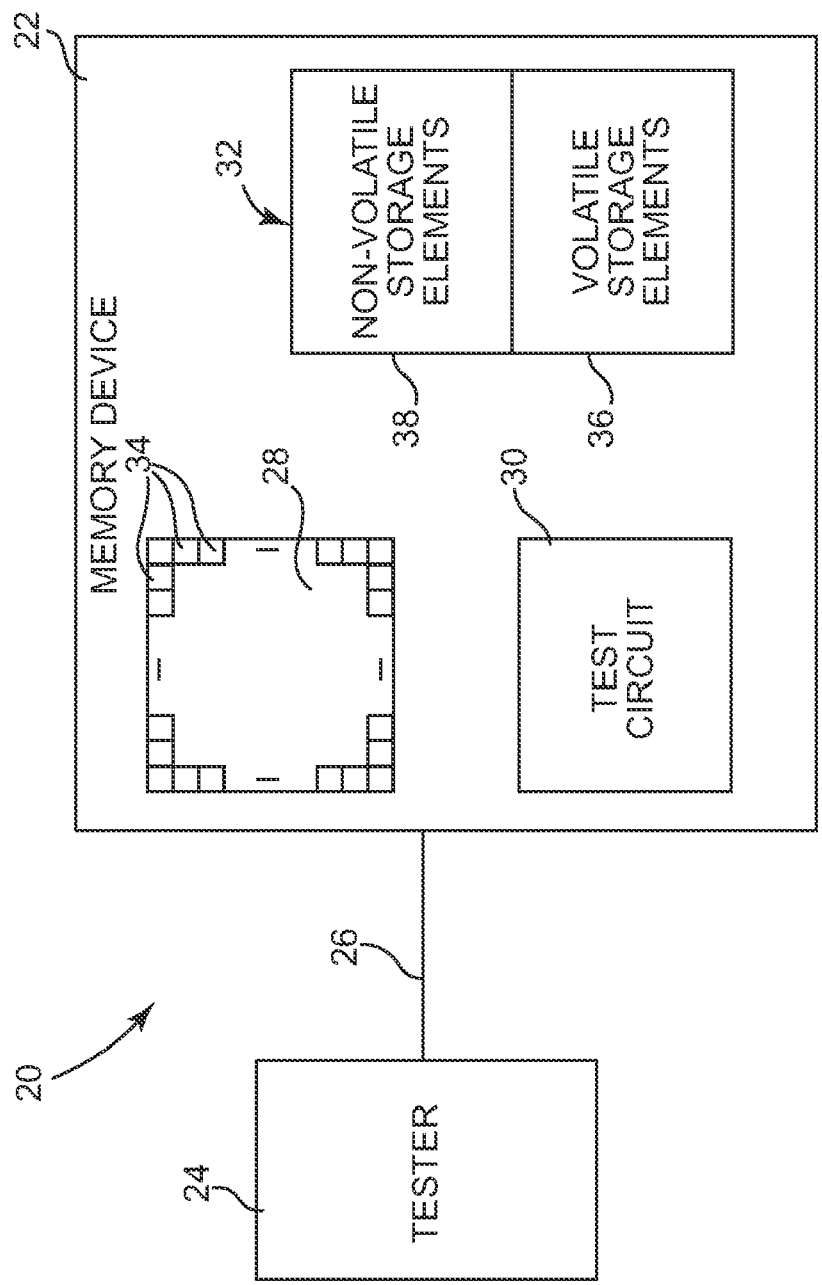
FIG. 1 is a diagram illustrating one embodiment of a system that repairs memory defects in a memory device.

FIG. 1 is a diagram illustrating one embodiment of a system 20 that repairs memory defects in memory device 22. System 20 includes memory device 22 and tester 24. Memory device 22 is electrically coupled to tester 24 via communications path 26. In one embodiment, memory device 22 is an integrated circuit on a semiconductor wafer. In one embodiment, memory device 22 is a packaged integrated circuit chip. In one embodiment, memory device 22 is a single integrated circuit chip. In one embodiment, memory device 22 includes multiple integrated circuit chips, such as multiple integrated circuit chips in a multi-chip package (MCP).

Memory device 22 includes an array of memory cells 28, a test circuit 30, and storage elements 32. The array of memory cells 28 includes memory cells 34 in one or more banks of memory cells. The array of memory cells 28 is tested to identify defective memory cells and obtain addresses of the defective memory cells. Test circuit 30 detects failed or defective memory cells in the array of memory cells 28 and provides the addresses of the defective memory cells. Storage elements 32 store the addresses of the defective memory cells and this information is used to replace the defective memory cells and repair memory device 22.

Storage elements 32 include volatile storage elements 36 and hard coded or non-volatile storage elements 38. Each entry in storage elements 32 includes information about a defective memory cell in the array of memory cells 28. In one embodiment, each entry in volatile storage elements 36 includes one of the addresses of a defective memory cell and a volatile storage master bit that indicates the volatile storage elements that follow include the address of a defective memory cell. In one embodiment, each entry in non-volatile storage elements 38 includes one of the addresses of a defective memory cell and a non-volatile storage master bit that indicates the non-volatile storage elements that follow include the address of a defective memory cell. In one embodiment, each entry in volatile storage elements 36 includes the row and column addresses of a defective memory cell and a volatile storage master bit that indicates the volatile storage elements that follow include the address of a defective memory cell. In one embodiment, each entry in non-volatile storage elements 38 includes the row and column addresses of a defective memory cell and a non-volatile storage master bit that indicates the non-volatile storage elements that follow include the address of a defective memory cell.

The array of memory cells 28 includes one or more banks of memory cells. In one embodiment, each entry in volatile storage elements 36 includes the bank address of a defective memory cell and a volatile storage master bit that indicates the volatile storage elements that follow include the address of a defective memory cell. In one embodiment, each entry in non-volatile storage elements 38 includes the bank address of a defective memory cell and a non-volatile storage master bit that indicates the non-volatile storage elements that follow include the address of a defective memory cell.

The storage elements 32 include separate sets of volatile storage elements 36 and separate sets of non-volatile storage elements 38. Each of the banks of memory cells is electrically coupled to a different one of the sets of volatile storage elements 36. Also, each of the sets of volatile storage elements 36 corresponds to one of the sets of non-volatile storage elements 38. In addition, each of the sets of non-volatile storage elements 38 corresponds to a different one of the banks of memory cells.

Defective memory cells are replaced by other memory cells via the addresses stored in the storage elements 32. In one embodiment, the other memory cells are redundant memory cells in the array of memory cells 28. In one embodiment, the other memory cells are redundant memory cells external to the array of memory cells 28. In one embodiment, the other memory cells are memory cells in an alternative memory. In one embodiment, memory cells 34 in the array of memory cells 28 are DRAM cells. In one embodiment, memory cells 34 in the array of memory cells 28 are SRAM cells. In one embodiment, memory cells 34 in the array of memory cells 28 are DRAM cells and memory cells in an alternative memory are SRAM cells. In one embodiment, memory cells in an alternative memory are Flash memory cells.

Memory device 22 and tester 24 communicate via communications path 26 to test and repair memory device 22. In one embodiment, memory device 22 is an integrated circuit in wafer form that is tested at wafer level testing. In one embodiment, memory device 22 is a packaged integrated circuit chip that is tested at package testing. In one embodiment, tester 24 tests the array of memory cells 28 and test circuit 30 detects defective memory cells and provides defective memory cell information. In one embodiment, memory device 22 includes a built-in-self-test (BIST) circuit that tests the array of memory cells 28 and includes test circuit 30 that detects defective memory cells and provides the defective memory cell information.

The array of memory cells 28 can be tested at wafer level testing to identify defective memory cells and laser-blown fuses on memory device 22 can be blown to replace the defective memory cells with other memory cells prior to packaging. After packaging, the array of memory cells 28 can be tested again and newly detected defective memory cells replaced with other memory cells via test circuit 30.

Figure 2:
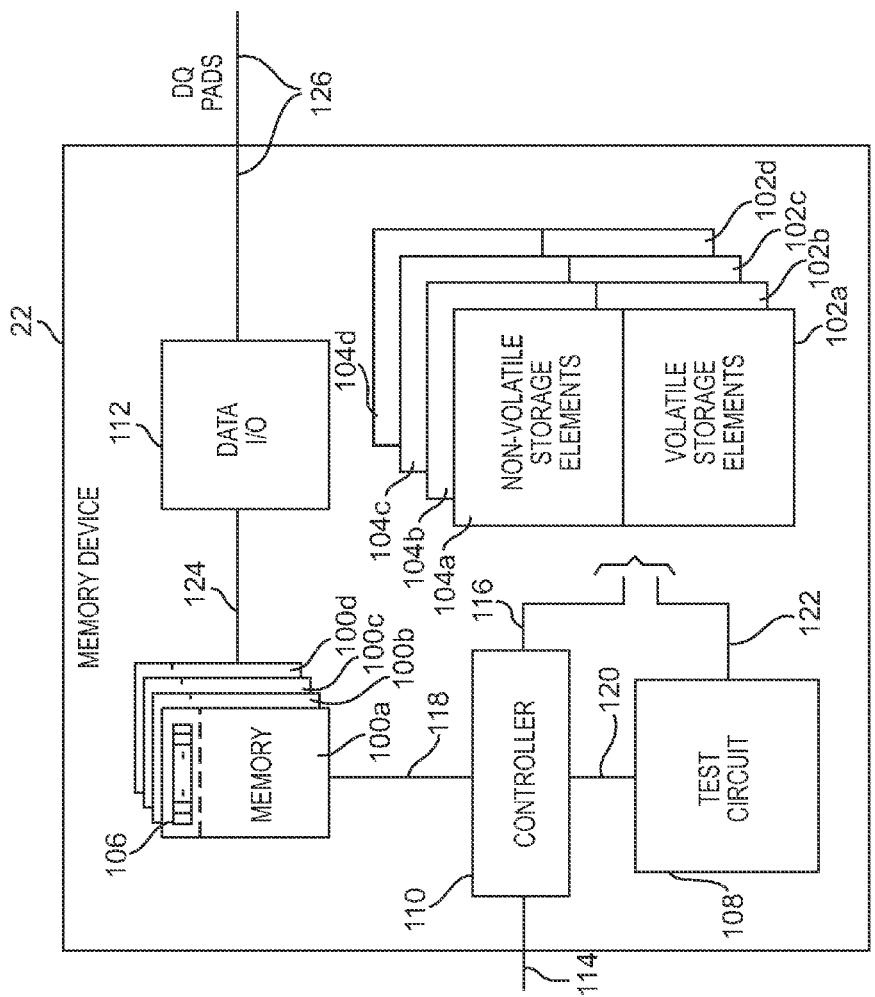
FIG. 2 is a diagram illustrating one embodiment of a memory device.

FIG. 2 is a diagram illustrating one embodiment of memory device 22 that includes four banks of memory cells 100a-100d, four sets of volatile storage elements 102a-102d, and four sets of non-volatile storage elements 104a-104d. The four banks of memory cells 100a-100d are similar to the array of memory cells 28 (shown in FIG. 1). The four sets of volatile storage elements 102a-102d are similar to the volatile storage elements 36 (shown in FIG. 1), and the four sets of non-volatile storage elements 104a-104d are similar to the non-volatile storage elements 38 (shown in FIG. 1).

Each of the four banks of memory cells 100a-100d includes memory cells 34 (shown in FIG. 1) and redundant memory cells 106. The redundant memory cells 106 are used to repair defective memory cells in the four banks of memory cells 100a-100d. In one embodiment, redundant memory cells external to the four banks of memory cells 100a-100d are used to repair defective memory cells in the four banks of memory cells 100a-100d. In one embodiment, memory device 22 includes an alternative memory having alternative memory cells, where the alternative memory cells and/or redundant memory cells 106 are used to repair defective memory cells in the four banks of memory cells 100a-100d.

Each of the banks of memory cells 100a-100d is electrically coupled to a different one of the four sets of volatile storage elements 102a-102d. For example, memory bank 1 at 100a is electrically coupled to the set of volatile storage elements at 102a, memory bank 2 at 100b is electrically coupled to the set of volatile storage elements at 102b, memory bank 3 at 100c is electrically coupled to the set of volatile storage elements at 102c, and memory bank 4 at 100d is electrically coupled to the set of volatile storage elements at 102d.

Also, each of the four sets of volatile storage elements 102a-102d corresponds to one of the four sets of non-volatile storage elements 104a-104d. The set of volatile storage elements 102a corresponds to the set of non-volatile storage elements 104a, the set of volatile storage elements 102b corresponds to the set of non-volatile storage elements 104b, the set of volatile storage elements 102c corresponds to the set of non-volatile storage elements 104c, and the set of volatile storage elements 102d corresponds to the set of non-volatile storage elements 104d.

In addition, each of the sets of non-volatile storage elements 104a-104d corresponds to a different one of the banks of memory cells 100a-100d. The set of non-volatile storage elements 104a corresponds to memory bank 1 at 100a, the set of non-volatile storage elements 104b corresponds to memory bank 2 at 100b, the set of non-volatile storage elements 104c corresponds to memory bank 3 at 100c, and the set of non-volatile storage elements 104d corresponds to memory bank 4 at 100d.

In one embodiment, the volatile storage elements 102a-102d are flip-flops. In one embodiment, the volatile storage elements 102a-102d are SRAM cells. In other embodiments, the volatile storage elements 102a-102d are any suitable volatile storage elements that can be dynamically written and over-written.

In one embodiment, the non-volatile storage elements 104a-104d include electrical fuses that are blown via a fuse blowing circuit (not shown). In one embodiment, the non-volatile storage elements 104a-104d include flash memory. In one embodiment, the non-volatile storage elements 104a-104d include electrically programmable read only memory. In one embodiment, the non-volatile storage elements 104a-104d include electrically erasable programmable read only memory.

Memory device 22 also includes a test circuit 108, a controller 110, and a data input/output (I/O) circuit 112. Test circuit 106 is similar to test circuit 30 (shown in FIG. 1).

Controller 110 receives commands and addresses via command bus 114. Controller 110 is electrically coupled to volatile storage elements 102a-102d and non-volatile storage elements 104a-104d via storage element communications path 116, to the four banks of memory cells 100a-100d via memory communications path 118, and to test circuit 108 via test circuit communications path 120. Test circuit 108 is electrically coupled to volatile storage elements 102a-102d and non-volatile storage elements 104a-104d via test communications path 122. Also, data I/O circuit 112 is electrically coupled to the four banks of memory cells 100a-100d via memory data path 124. Data I/O circuit 112 receives data from and provides data to DQ pads at 126.

Controller 110 receives test commands and addresses from tester 24 to test the four banks of memory cells 100a-100d. Data is written into the four banks of memory cells 100a-100d and read from the four banks of memory cells 100a-100d to test memory device 22. Controller 110 provides control signals and addresses to the four banks of memory cells 100a-100d via memory communications path 118 to write data into and read data from the four banks of memory cells 100a-100d. The four banks of memory cells 100a-100d receive write data that is internally generated from a pre-defined set of data in memory device 22 and/or write data from DQ pads at 126 and data I/O circuit 112 via memory data path 124. The four banks of memory cells 100a-100d provide read data to test circuit 108 via memory communications path 118, controller 110, and test circuit communications path 120. In one embodiment, the four banks of memory cells 100a-100d provide read data to data I/O circuit 112 via memory data path 124 and data I/O circuit 112 provides the data to DQ pads at 126.

Test circuit 108 receives internally generated expected results or expected results from tester 24. Test circuit 108 checks the received read data against the expected results to detect and identify defective memory cells. Test circuit 108 and controller 110 compare detected defective memory cell addresses to defective memory cell addresses already stored in the four sets of volatile storage elements 102a-102d. If a detected defective memory cell address is different than the stored defective memory cell addresses, the new defective memory cell address is stored into one of the four sets of volatile storage elements 102a-102d.

Test circuit 108 provides each defective memory cell address to the one set of volatile storage elements 102a-102d that corresponds to the bank of memory cells 100a-100d that includes the defective memory cell 34. Controller 110 and test circuit 108 write the defective memory cell address into the set of volatile storage elements 102a-102d via test communications path 122. In one embodiment, since each of the banks of memory cells 100a-100d is electrically coupled to a different one of the sets of volatile storage elements 102a-102d, the bank address is not stored. In one embodiment, row and column addresses are stored. In one embodiment, a row address or a column address is stored. In other embodiments, bank addresses are stored along with a row address and/or a column address.

In another embodiment, memory device 22 includes a BIST circuit that includes test circuit 108. Controller 110 receives a test command from tester 24 via command bus 114 and provides a control signal to the BIST circuit, which begins testing the four banks of memory cells 100a-100d in response to the control signal. The BIST circuit provides control signals, data, and addresses to controller 110 and controller 110 provides control signals, data, and addresses to the four banks of memory cells 100a-100d via memory communications path 118. Data is written into the four banks of memory cells 100a-100d and read from the four banks of memory cells 100a-100d to test memory device 22. The four banks of memory cells 100a-100d provide read data to test circuit 108 that receives the read data from the four banks of memory cells 100a-100d and checks the received read data against expected results to detect and identify defective memory cells. Test circuit 108 and controller 110 compare each detected defective memory cell address to defective memory cell addresses already stored in one of the four sets of volatile storage elements 102a-102d. If the detected defective memory cell address is different than the stored defective memory cell addresses, the new defective memory cell address is stored into one of the four sets of volatile storage elements 102a-102d. Test circuit 108 captures defective memory cell addresses and writes the defective memory cell addresses into volatile storage elements 102a-102d via test communications path 122.

In any embodiment, the defective memory cell addresses in the four sets of volatile storage elements 102a-102d are programmed into the corresponding sets of non-volatile storage elements 104a-104d. Each of the four sets of non-volatile storage elements 104a-104d is programmed via the corresponding one of the sets of volatile storage elements 102a-102d. The stored addresses are used to identify and replace defective memory cells with redundant memory cells 106. In other embodiments, the stored addresses are used to identify and replace defective memory cells with one or more of redundant memory cells 106, redundant memory cells external to the four banks of memory cells 100a-100d and/or alternative memory cells from an alternative memory.

In normal operation, controller 110 receives a command and an address and compares the address to addresses of defective memory cells stored in the four sets of non-volatile storage elements 104a-104d. If the addresses do not match, controller 110 provides control signals and addresses to the four banks of memory cells 100a-100d to read data from or write data into the four banks of memory cells 100a-100d. Data read from the four banks of memory cells 100a-100d is provided to data I/O circuit 112 via memory data path 124 and data I/O circuit 112 provides the data to DQ pads at 126. Data written into the four banks of memory cells 100a-100d is received from data I/O circuit 112 that receives the write data via DQ pads at 126. If the addresses match, controller 110 provides control signals and corresponding redundant memory cell addresses to the four banks of memory cells 100a-100d to read data from or write data into the redundant memory cells 106. Data read from redundant memory cells 106 is provided to data I/O circuit 112 via memory data path 124 and data I/O circuit 112 provides the data to DQ pads at 126. Data written into redundant memory cells 106 is received from data I/O circuit 112 that receives the write data via DQ pads at 126.

In other embodiments, if the addresses match, controller 110 provides control signals and corresponding memory cell addresses to read data from or write data into redundant memory cells that are external to the four banks of memory cells 100a-100d and/or alternative memory cells from an alternative memory.

Figure 3:
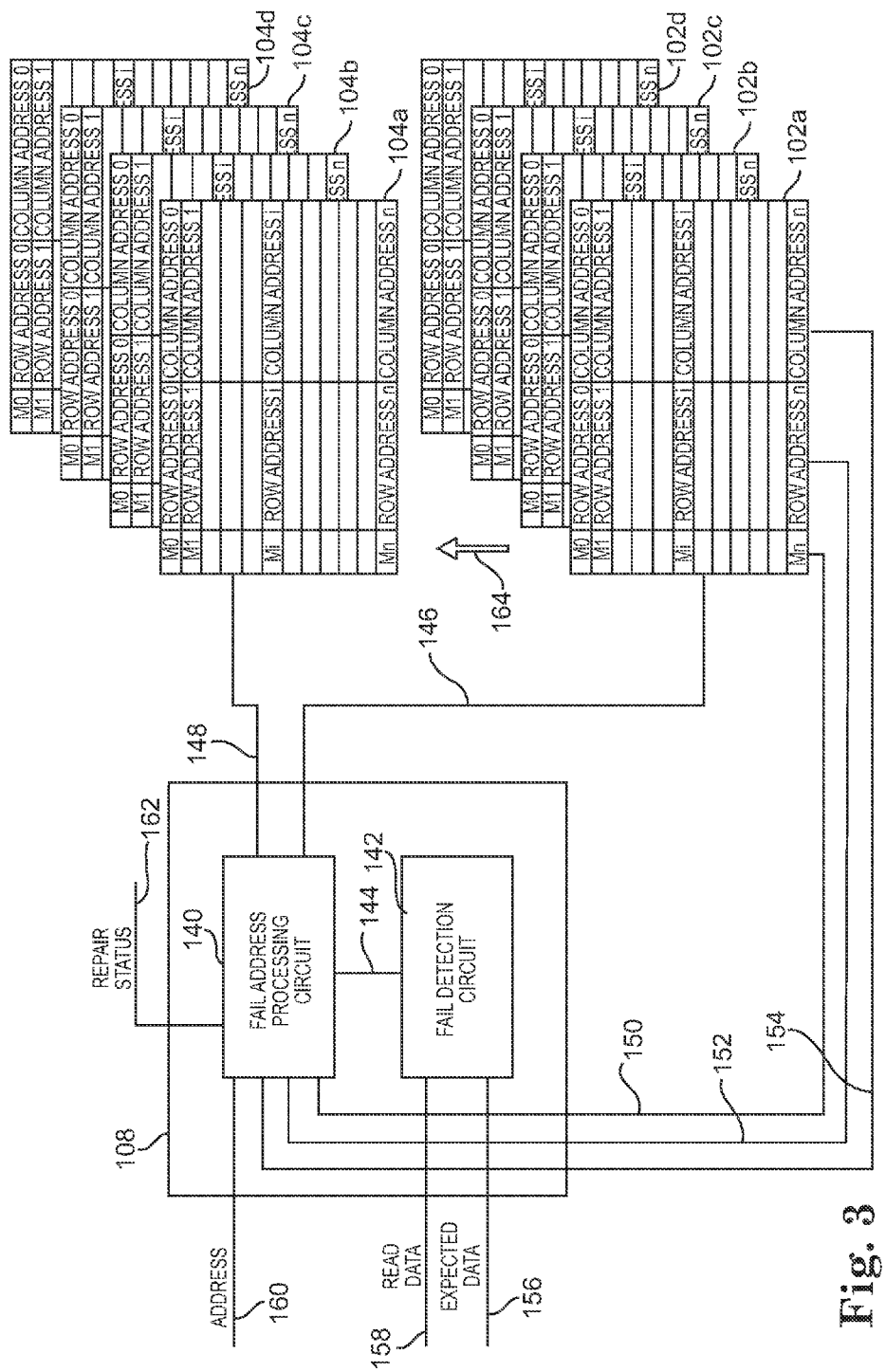
FIG. 3 is a diagram illustrating one embodiment of a test circuit, four sets of volatile storage elements and four sets of non-volatile storage elements.

FIG. 3 is a diagram illustrating one embodiment of test circuit 108, the four sets of volatile storage elements 102a-102d, and the four sets of non-volatile storage elements 104a-104d. Test circuit 108 includes fail address processing circuit 140 and fail detection circuit 142. Fail address processing circuit 140 is electrically coupled to fail detection circuit 142 via pass/fail communications path 144.

Fail address processing circuit 140 is electrically coupled to the four sets of volatile storage elements 102a-102d via volatile storage communications path 146 and to the four sets of non-volatile storage elements 104a-104d via non-volatile storage communications path 148. Fail address processing circuit 140 is also electrically coupled to the four sets of volatile storage elements 102a-102d via master bit communications path 150, row address communications path 152, and column address communications path 154. The four sets of volatile storage elements 102a-102d are electrically coupled to non-volatile storage elements 104a-104d via storage element communications path 164.

Fail detection circuit 142 receives expected data at 156 from a tester, such as tester 24, a controller 110, or a BIST circuit in memory device 22. Fail detection circuit 142 receives read data at 158 from the banks of memory cells 100a-100d as they are tested. Fail detection circuit 142 compares the read data at 158 to the expected data at 156 to detect and identify defective memory cells. Fail detection circuit 142 provides pass/fail signals via pass/fail communications path 144 based on the comparison results. If the read data at 158 matches the expected data at 156, fail detection circuit 142 provides a pass signal in the pass/fail signals at 144. If the read data at 158 does not match the expected data at 156, fail detection circuit 142 provides a fail signal in the pass/fail signals at 144.

Fail address processing circuit 140 receives addresses at 160 from controller 110 or a BIST circuit in memory device 22. The addresses at 160 indicate the locations of memory cells 34 tested in the banks of memory cells 100a-100d. Fail address processing circuit 140 receives the pass/fail signals via pass/fail communications path 144 and captures the addresses of failing or defective memory cells in response to fail signals in the pass/fail signals at 144.

Fail address processing circuit 140 retrieves addresses of defective memory cells already stored in the four sets of volatile storage elements 102a-102d. Fail address processing circuit 140 checks the volatile storage master bits M0-Mn in the set of volatile storage elements 102a-102d that corresponds to the bank of memory cells 100a-100d that includes the defective memory cell. If one of the volatile storage master bits M0-Mn is set, fail address processing circuit 140 retrieves the row address and the column address that follows the set volatile storage master bit and compares the newly captured defective memory cell address to the stored defective memory cell address. If the captured defective memory cell address matches the stored defective memory cell address, the captured defective memory cell address is not stored a second time. If the captured defective memory cell address is different than all of the stored defective memory cell addresses, the captured defective memory cell address is stored into the corresponding set of volatile storage elements 102a-102d at the next available volatile storage master bit Mi. If all of the volatile storage master bits M0-Mn in one of the sets of volatile storage elements 102a-102d are set or programmed, fail address processing circuit 140 provides a repair status flag at 162 that indicates all of the volatile storage master bits M0-Mn in the set of volatile storage elements 102a-102d are used or programmed and the maximum number of repairs has been reached for the bank of memory cells 100a-100d.

Fail address processing circuit 140 provides each defective memory cell address to the set of volatile storage elements 102a-102d that corresponds to the bank of memory cells 100a-100d that includes the defective memory cell. Controller 110 and fail address processing circuit 140 write the defective memory cell address into the set of volatile storage elements 102a-102d via volatile storage communications path 146. The next available volatile storage master bit Mi is set or programmed in the set of volatile storage elements 102a-102d and the row address and the column address of the defective memory cell is programmed into the storage elements that follow this volatile storage master bit Mi. To store another defective memory cell address for the same bank of memory cells 100a-100d, the next available volatile storage master bit Mi+1 is set or programmed in the set of volatile storage elements 102a-102d and the row address and the column address of the defective memory cell is programmed into the storage elements that follow this next volatile storage master bit Mi+1. In one embodiment, since each of the banks of memory cells 100a-100d is electrically coupled to a different one of the sets of volatile storage elements 102a-102d, the bank address is not stored. In one embodiment, bank addresses are stored along with the row address and the column address. In other embodiments, only a row address or a column address is stored with or without a bank address.

The defective memory cell addresses in the four sets of volatile storage elements 102a-102d are programmed into the corresponding sets of non-volatile storage elements 104a-104d. Fail address processing circuit 140 provides a hard coding signal at 148 to program the sets of non-volatile storage elements 104a-104d. Each of the sets of non-volatile storage elements 104a-104d is programmed via the corresponding set of volatile storage elements 102a-102d. Non-volatile storage master bits M0-Mn are programmed in the set of non-volatile storage elements 104a-104d based on the volatile storage master bits M0-Mn in the volatile storage elements 102a-102d and the defective memory cell row address and column address follow each used or programmed non-volatile storage master bit. The stored row and column addresses are used to identify and replace defective memory cells with redundant memory cells 106. In other embodiments, the addresses are used to identify and replace defective memory cells with one or more of redundant memory cells 106, redundant memory cells external to the four banks of memory cells 100a-100d and/or alternative memory cells from an alternative memory.

In normal operation, controller 110 receives a command and an address and compares the address to addresses of defective memory cells stored in the four sets of non-volatile storage elements 104a-104d. In one embodiment, controller 110 accesses the set of non-volatile storage elements 104a-104d corresponding to the addressed bank of memory cells 100a-100d and checks the non-volatile storage master bits M0-Mn. If one of the non-volatile storage master bits M0-Mn is set, controller 110 accesses the row address and the column address that follows the set non-volatile master bit and compares it to the incoming address.

If the incoming address does not match any of the addresses of the defective memory cells stored in the non-volatile storage elements 104a-104d, controller 110 provides control signals and addresses to the four banks of memory cells 100a-100d to read data from or write data into the four banks of memory cells 100a-100d. Data read from the four banks of memory cells 100a-100d is provided to data I/O circuit 112, which provides the data to DQ pads at 126. Data written into the four banks of memory cells 100a-100d is received from data I/O circuit 112 that receives the write data via DQ pads at 126.

If the incoming address matches one of the addresses of defective memory cells stored in the non-volatile storage elements 104a-104d, controller 110 provides control signals and corresponding redundant memory cell addresses to the four banks of memory cells 100a-100d to read data from or write data into the redundant memory cells 106. Data read from redundant memory cells 106 is provided to data I/O circuit 112, which provides the data to DQ pads at 126. Data written into redundant memory cells 106 is received from data I/O circuit 112 that receives the write data via DQ pads at 126.

Figure 4:
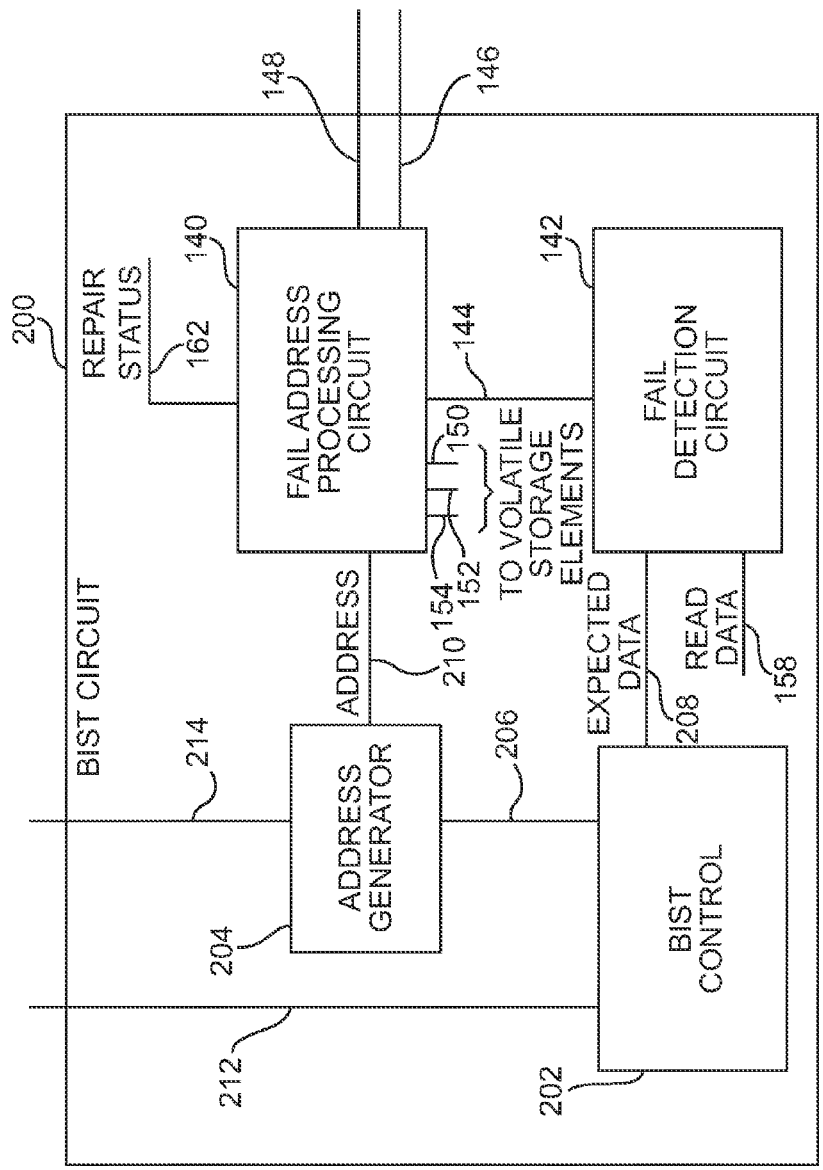
FIG. 4 is a diagram illustrating one embodiment of a built-in-self-test (BIST) circuit in a memory device.

FIG. 4 is a diagram illustrating one embodiment of a BIST circuit 200 in a memory device 22. BIST circuit 200 includes fail address processing circuit 140 and fail detection circuit 142. BIST circuit 200 also includes a BIST control circuit 202 and an address generator 204. BIST circuit 200 tests and detects failures in the four banks of memory cells 100a-100d. The failures can be hard failures, such as stuck-at-one or stuck-at-zero failures, insufficient data retention times, or other failures that prevent the device from operating efficiently.

BIST control circuit 202 is electrically coupled to address generator 204 via address generator communications path 206 and to fail detection circuit 142 via expected data path 208. Fail detection circuit 142 is electrically coupled to fail address processing circuit 140 via pass/fail communications path 144 and address generator 204 is electrically coupled to fail address processing circuit 140 via address communications path 210.

BIST control circuit 202 receives a control signal from a controller, such as controller 110 (shown in FIG. 2), via BIST circuit communications path 212. In response to the control signal at 212, BIST circuit 200 begins testing the four banks of memory cells 100a-100d.

BIST control circuit 202 provides an address generation signal that is received by address generator 204 via address generator communications path 206. In response to the address generation signal at 206, address generator 204 provides addresses to the controller and the four banks of memory cells 100a-100d via memory address path 214. BIST control circuit 202 also provides write data at 212 to the controller to write into the four banks of memory cells 100a-100d.

Fail detection circuit 142 receives expected data results from BIST control circuit 202 via expected data path 208 and read data at 158 from the four banks of memory cells 100a-100d. Fail detection circuit 142 compares the expected data at 208 to the read data at 158 and obtains failure results. If a failure is detected, fail detection circuit 142 indicates the failure to fail address processing circuit 140 in the pass/fail signal at 144. Fail address processing circuit 140 receives addresses at 210 and the pass/fail signal at 144 and captures the address of the failed memory cell.

Fail address processing circuit 140 retrieves addresses of defective memory cells already stored in the four sets of volatile storage elements 102a-102d via master bit communications path 150, row address communications path 152, and column address communications path 154. Fail address processing circuit 140 checks the volatile storage master bits M0-Mn in the set of volatile storage elements 102a-102d that corresponds to the bank of memory cells 100a-100d that includes the defective memory cell 34. If one of the volatile storage master bits M0-Mn is set, fail address processing circuit 140 retrieves the row address and the column address that follows the set volatile storage master bit and compares the newly captured defective memory cell address to the stored defective memory cell address. If the captured defective memory cell address matches the stored defective memory cell address, the captured defective memory cell address is not stored a second time. If the captured defective memory cell address is different than all of the stored defective memory cell addresses, the captured defective memory cell address is stored into the corresponding set of volatile storage elements 102a-102d. If all of the volatile storage master bits M0-Mn in one of the sets of volatile storage elements 102a-102d are set or programmed, fail address processing circuit 140 provides a repair status flag at 162 that indicates all of the volatile storage master bits M0-Mn in the set of volatile storage elements 102a-102d are used or programmed and the maximum number of repairs has been reached for the bank of memory cells 100a-100d.

Fail address processing circuit 140 provides each defective memory cell address to the set of volatile storage elements 102a-102d that corresponds to the bank of memory cells 100a-100d that includes the defective memory cell. Fail address processing circuit 140 provides the address of the defective memory cell to the set of volatile storage elements 102a-102d via volatile storage communications path 146. The next available master bit Mi is set or programmed in the set of volatile storage elements 102a-102d and the row address and the column address of the defective memory cell is programmed into the storage elements that follow the volatile storage master bit Mi. To store another defective memory cell address for the same bank of memory cells 100a-100d, the next available master bit Mi+1 is set or programmed in the set of volatile storage elements 102a-102d and the row address and the column address of the defective memory cell is programmed into the storage elements that follow this next volatile storage master bit Mi+1.

Fail address processing circuit 140 provides a hard coding signal to the sets of non-volatile storage elements 104a-104d via non-volatile storage communications path 148 to program the sets of non-volatile storage elements 104a-104d. In response to the hard coding signal at 148, each of the sets of non-volatile storage elements 104a-104d is programmed via the corresponding set of volatile storage elements 102a-102d. The stored addresses are used to identify and replace defective memory cells with other memory cells, such as redundant memory cells 106.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
   an array of memory cells;
   volatile storage configured to store identified addresses of defective memory cells, wherein each entry in the volatile storage includes one of the identified addresses and a volatile storage master bit;
   non-volatile storage configured to store the identified addresses, wherein each entry in the non-volatile storage includes one of the identified addresses and a non-volatile storage master bit; and
   a circuit configured to detect defective memory cells in the array of memory cells and provide captured addresses of detected defective memory cells, wherein the circuit retrieves the identified addresses from the volatile storage and compares each captured address of the captured addresses to retrieved identified addresses, and the circuit does not store a compared captured address into the volatile storage if the compared captured address matches one of the retrieved identified addresses and the circuit stores the compared captured address into the volatile storage if the compared captured address does not match one of the retrieved identified addresses, and each stored compared captured address in the volatile storage is stored into the non-volatile storage.

2. The integrated circuit of claim 1, wherein the array of memory cells includes banks of memory cells and the volatile storage includes sets of volatile storage elements, wherein each of the banks of memory cells is electrically coupled to a different one of the sets of volatile storage elements.

3. The integrated circuit of claim 2, wherein the non-volatile storage includes sets of non-volatile storage elements, wherein each of the sets of non-volatile storage elements corresponds to a different one of the banks of memory cells.

4. The integrated circuit of claim 2, wherein the circuit provides a repair status flag that indicates all of the volatile storage master bits in one of the sets of volatile storage elements are used.

5. The integrated circuit of claim 2, wherein the circuit is configured to provide bank addresses of the defective memory cells and each entry in the volatile storage includes a bank address.

6. The integrated circuit of claim 1, wherein the volatile storage includes sets of volatile storage elements and the non-volatile storage includes sets of non-volatile storage elements and each of the sets of non-volatile storage elements corresponds to one of the sets of volatile storage elements.

7. The integrated circuit of claim 6, wherein each of the sets of non-volatile storage elements is programmed via the corresponding one of the sets of volatile storage elements.

8. The integrated circuit of claim 1, wherein the non-volatile storage includes at least one of electrical fuses, flash memory, electrically programmable read only memory, and electrically erasable programmable read only memory.

9. The integrated circuit of claim 1, comprising:
a built-in-self-test circuit configured to test the array of memory cells.

10. A memory device comprising:
banks of memory cells;
volatile storage configured to store identified addresses of defective memory cells and including sets of volatile storage elements; and
non-volatile storage configured to store the identified addresses and including sets of non-volatile storage elements, wherein each of the banks of memory cells is electrically coupled to a different one of the sets of volatile storage elements and each of the sets of non-volatile storage elements corresponds to a different one of the banks of memory cells and to a different set of the sets of volatile storage elements; and
a circuit configured to detect defective memory cells in the banks of memory cells and provide captured addresses of detected defective memory cells, wherein the circuit retrieves the identified addresses from the volatile storage and compares each captured address of the captured addresses to retrieved identified addresses, and the circuit does not store a compared captured address into the volatile storage if the compared captured address matches one of the retrieved identified addresses and the circuit stores the compared captured address into the volatile storage if the compared captured address does not match one of the retrieved identified addresses, and each stored compared captured address in the volatile storage is stored into the non-volatile storage via programming each of the sets of non-volatile storage elements with the corresponding different set of the sets of volatile storage elements.

11. The memory device of claim 10, wherein the circuit provides row and column addresses of the defective memory cells and each entry in the volatile storage includes one of the row and column addresses and a volatile storage master bit.

12. The memory device of claim 11, wherein each entry in the non-volatile storage includes one of the row and column addresses and a non-volatile storage master bit.

13. The memory device of claim 11, wherein the circuit provides a repair status flag that indicates all of the volatile storage master bits in one of the sets of volatile storage elements are used.

14. The memory device of claim 10, wherein the circuit is configured to provide bank addresses of the defective memory cells and each entry in the volatile storage includes a bank address.

15. A method of repairing a memory, comprising:
storing identified row and column addresses of defective memory cells in volatile storage;
storing the identified row and column addresses in non-volatile storage;
storing one of the identified row and column addresses and a volatile storage master bit in each entry in the volatile storage;
storing one of the identified row and column addresses and a non-volatile storage master bit in each entry in the non-volatile storage;
detecting defective memory cells in an array of memory cells;
providing captured row and column addresses of detected defective memory cells;
retrieving the identified row and column addresses from the volatile storage;
comparing each captured row and column address of the captured addresses to retrieved identified row and column addresses;
discarding a compared captured row and column address without storing the compared captured row and column address into the volatile storage if the compared captured row and column address matches one of the retrieved identified row and column addresses;
storing the compared captured row and column address into the volatile storage if the compared captured row and column address does not match one of the retrieved identified row and column addresses; and
storing each stored compared captured row and column address in the volatile storage into the non-volatile storage.

16. The method of claim 15, wherein:
storing the identified row and column addresses of defective memory cells in volatile storage includes storing the identified row and column addresses in sets of volatile storage elements; and
detecting includes detecting defective memory cells in banks of memory cells that are each electrically coupled to a different one of the sets of volatile storage elements.

17. The method of claim 16, wherein:
storing the identified row and column addresses in non-volatile storage includes storing the identified row and column addresses in sets of non-volatile storage elements that each correspond to one of the banks of memory cells.

18. The method of claim 16, comprising:
providing a repair status flag that indicates all of the volatile storage master bits in one of the sets of volatile storage elements are used.

19. A method of repairing a memory, comprising:
storing identified addresses of defective memory cells in sets of volatile storage elements that are each electrically coupled to a different one of banks of memory cells;

storing the identified addresses in sets of non-volatile storage elements that each correspond to a different one of the banks of memory cells;

detecting defective memory cells in the banks of memory cells;

providing captured addresses of detected defective memory cells;

retrieving the identified addresses from the volatile storage;

comparing each captured address of the captured addresses to retrieved identified addresses;

discarding a compared captured address without storing the compared captured address into the volatile storage if the compared captured address matches one of the retrieved identified addresses;

storing the compared captured address into the volatile storage if the compared captured address does not match one of the retrieved identified addresses; and storing each stored compared captured address in the volatile storage into the non-volatile storage.

20. The method of claim 19, wherein:

providing captured addresses includes providing captured row and column addresses of the detected defective memory cells; and storing the compared captured address includes storing one of the captured row and column addresses and a volatile storage master bit into the volatile storage.

* * * * *